United States Patent
Kang et al.

(10) Patent No.: US 8,564,079 B2
(45) Date of Patent: Oct. 22, 2013

(54) STT MRAM MAGNETIC TUNNEL JUNCTION ARCHITECTURE AND INTEGRATION

(75) Inventors: Seung H. Kang, San Diego, CA (US); Xia Li, San Diego, CA (US); Shiqun Gu, San Diego, CA (US); Kangho Lee, San Diego, CA (US); Xiaochun Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 580 days.

(21) Appl. No.: 12/355,941

(22) Filed: Jan. 19, 2009

(65) Prior Publication Data

US 2009/0261434 A1 Oct. 22, 2009

Related U.S. Application Data

(60) Provisional application No. 61/046,520, filed on Apr. 21, 2008.

(51) Int. Cl.
*H01L 21/00* (2006.01)
*H01L 29/82* (2006.01)

(52) U.S. Cl.
USPC .... 257/421; 257/422; 257/659; 257/E23.114; 257/E29.323; 257/E43.001

(58) Field of Classification Search
USPC .......... 257/421, 422, 659, E23.114, E29.323, 257/E43.006, E43.001
See application file for complete search history.

(56) References Cited

U.S. PATENT DOCUMENTS

| 5,480,810 A | 1/1996 | Wei et al. |
| 2002/0173152 A1 | 11/2002 | Chen |
| 2004/0081841 A1 | 4/2004 | Nakajima |

(Continued)

FOREIGN PATENT DOCUMENTS

| EP | 1132918 | 9/2001 |
| JP | 2002246565 A | 8/2002 |

(Continued)

OTHER PUBLICATIONS

International Search Report—PCT/US2009/041132, International Search Authority—European Patent Office Sep. 15, 2009.

(Continued)

*Primary Examiner* — Lynne Gurley
*Assistant Examiner* — Vernon P Webb
(74) *Attorney, Agent, or Firm* — Sam Talpalatsky; Nicholas J. Pauley; Joseph Agusta (57) ABSTRACT

A magnetic tunnel junction (MTJ) device for a magnetic random access memory (MRAM) in a semiconductor back-end-of-line (BEOL) process flow includes a first metal interconnect for communicating with at least one control device and a first electrode for coupling to the first metal interconnect through a via formed in a dielectric passivation barrier using a first mask. The device also includes an MTJ stack for storing data coupled to the first electrode, a portion of the MTJ stack having lateral dimensions based upon a second mask. The portion defined by the second mask is over the contact via. A second electrode is coupled to the MTJ stack and also has a same lateral dimension as defined by the second mask. The first electrode and a portion of the MTJ stack are defined by a third mask. A second metal interconnect is coupled to the second electrode and at least one other control device.

11 Claims, 5 Drawing Sheets

(56) References Cited

U.S. PATENT DOCUMENTS

| | | |
|---|---|---|
| 2005/0277206 A1 | 12/2005 | Gaidis |
| 2005/0280040 A1* | 12/2005 | Kasko et al. .................. 257/213 |
| 2008/0049488 A1 | 2/2008 | Rizzo |

FOREIGN PATENT DOCUMENTS

| | | |
|---|---|---|
| JP | 2005109470 A | 4/2005 |
| JP | 2006054046 A | 2/2006 |
| JP | 2007521629 A | 8/2007 |
| WO | 2006070803 A1 | 7/2006 |

OTHER PUBLICATIONS

Written Opinion—PCT/US2009/041132, International Search Authority—European Patent Office Sep. 15, 2009.
Taiwan Search Report—TW098113263—TIPO—Apr. 19, 2013.

* cited by examiner

PRIOR ART

STT MRAM MAGNETIC TUNNEL JUNCTION ARCHITECTURE AND INTEGRATION

CROSS REFERENCE TO RELATED APPLICATION

This application claims the benefit of U.S. provisional patent application No. 61/046,520, entitled "STT MRAM MAGNETIC TUNNEL JUNCTION ARCHITECTURE AND INTEGRATION" by Seung H. Kang, et al., filed Apr. 21, 2008.

TECHNICAL FIELD

This disclosure relates to integrated electronic circuitry, and in particular, to magnetic random access memory (MRAM) and methods of integration with standard integrated circuitry.

BACKGROUND

Unlike conventional random access memory (RAM) chip technologies, in magnetic RAM (MRAM) data is not stored as electric charge, but is instead stored by magnetic polarization of storage elements. The elements are formed from two magnetically polarized plates, each of which can maintain a magnetic polarization field, separated by a thin insulating layer, which together form a magnetic tunnel junction (MTJ). One of the two plates is a permanent magnet (hereinafter "fixed layer") set to a particular polarity; the polarization of the other plate (hereinafter "free magnetization layer" or "free layer") will change to match that of a sufficiently strong external field. A memory device may be built from a grid of such cells.

Reading the polarization state of an MRAM cell is accomplished by measuring the electrical resistance of the cell's MTJ. A particular cell is conventionally selected by powering an associated transistor that switches current from a supply line through the MTJ to a ground. Due to the tunneling magnetoresistance effect, the electrical resistance of the cell changes due to the relative orientation of the polarizations in the two magnetic layers of the MTJ. By measuring the resulting current, the resistance inside any particular cell can be determined, and from this the polarity of the free writable layer determined. If the two layers have the same polarization, this is considered to mean State "0", and the resistance is "low," while if the two layers are of opposite polarization the resistance will be higher and this means State "1".

Data is written to the cells using a variety of techniques. In conventional MRAM, an external magnetic field is provided by current in a wire in proximity to the cell, which is strong enough to align the free layer. Spin-transfer-torque (STT) MRAM uses spin-aligned ("polarized") electrons to directly torque the domains of the free layer. Specifically, such polarized electrons flowing into the free layer by exerting a sufficient torque to realign (e.g., reverse) the magnetization of the free layer One significant determinant of a memory system's cost is the density of the components. Smaller components, and fewer components for each cell, enable more cells to be packed onto a single chip, which in turn means more chips can be produced at once from a single semiconductor wafer and fabricated at lower cost and improved yield. Scaling integrated circuits to higher device pitch density, however, increases the demands on the critical dimensions of mask registration in fabricating the multiple layers of such devices.

In addition, the manufacturing process flow impacts cost. The conventional processes to fabricate MRAM are complex, requiring a number of masks dedicated solely to the fabrication of the magnetic tunnel junction (MTJ) structure. There is a need, therefore, for improved methods for MRAM fabrication, especially if the fabrication processes could be integrated into the conventional semiconductor BEOL (back-end-of-line) process flow with relaxed mask registration requirements.

SUMMARY

A magnetic random access memory (MRAM) device and method of integrating fabrication processes of the MRAM device into standard back-end-of-line (BEOL) integrated circuit manufacturing is disclosed.

In an aspect, a magnetic tunnel junction (MTJ) device for a magnetic random access memory (MRAM) device includes a substrate having a first metal interconnect; and a first dielectric passivation barrier layer formed on the substrate. The first dielectric passivation barrier layer has a first contact via formed with a first mask pattern to expose the first metal interconnect. The device also includes a first electrode layer formed on the first dielectric passivation barrier layer and the first contact via, a fixed magnetization layer formed on the first electrode layer, a tunnel barrier layer formed on the fixed magnetization layer, and a free magnetization layer formed on the tunnel barrier layer. The first electrode layer is in communication with the first metal interconnect. The device also includes a second electrode layer formed on the free magnetization layer. At least the second electrode layer and the free magnetization layer have a shape based upon a second mask pattern and are located over the first contact via. The device further includes a second dielectric passivation barrier layer formed on the fixed magnetization layer and around the tunnel barrier layer, the free magnetization layer and the second electrode layer. The second dielectric passivation barrier layer only partially covers the second electrode layer. The second dielectric passivation barrier layer and at least a first portion of the fixed magnetization layer have a shape based upon a third mask pattern.

In another aspect, a method for integrating a magnetic tunnel junction (MTJ) device into an integrated circuit includes providing in a semiconductor back-end-of-line (BEOL) process flow a substrate having a first interlevel dielectric layer and a first metal interconnect. The method includes depositing on the substrate a first dielectric passivation barrier layer having a first contact via formed with a first mask pattern to expose the first metal interconnect. The method further includes depositing over the first interlevel dielectric layer, the first metal interconnect and the first dielectric passivation barrier layer, a first electrode layer in communication with the first metal interconnect, a fixed magnetization layer on the first electrode layer, a tunnel barrier layer on the fixed magnetization layer, a free magnetization layer on the tunnel barrier layer, and a second electrode layer on the free magnetization layer. The method still further includes patterning an MTJ stack, over the first contact via, with a second mask pattern, in which the MTJ stack includes the free magnetization layer and the second electrode layer. The method also includes depositing a second dielectric passivation barrier layer around the MTJ stack. The second dielectric passivation barrier layer is formed to leave the second electrode layer exposed. The method also includes depositing a third electrode layer on the second dielectric passivation barrier layer in communication with the second electrode layer. The method further includes patterning the first electrode layer, at least a portion of the fixed magnetization layer, and the second dielectric passivation barrier layer with a third mask pattern.

In yet another aspect, a magnetic tunnel junction (MTJ) structure for magnetic random access memory (MRAM) has a first interconnect means for communicating with at least one control device. The structure also has a first electrode means for coupling to the first interconnect means through a contact via formed in a dielectric passivation barrier using a first mask. The structure includes an MTJ means for storing data, the MTJ means coupling to the first electrode means. A lateral dimension of a portion of the MTJ means is defined by a second mask. The structure also has a second electrode means for coupling to the MTJ means, the second electrode means having a same lateral dimension as the portion of the MTJ means defined by the second mask. The structure has a third electrode means and a second interconnect means. The third electrode means is for coupling to the second electrode means. The third electrode means, a portion of the MTJ means and the first electrode means have a shape based upon a third mask. The second interconnect means is for coupling to the third electrode means and at least one other control device.

The foregoing has outlined rather broadly the features and technical advantages of the present disclosure in order that the detailed description of the embodiments that follow may be better understood. Additional features and advantages of the embodiments will be described hereinafter which form the subject of the claims of the disclosure. It should be appreciated by those skilled in the art that the conception and specific embodiments disclosed may be readily utilized as a basis for modifying or designing other structures for carrying out the same purposes of the present disclosure. It should also be realized by those skilled in the art that such equivalent constructions do not depart from the spirit and scope of the disclosure as set forth in the appended claims. The novel features which are believed to be characteristic of the disclosure, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present embodiments of the disclosure.

DESCRIPTION OF THE FIGURES

For a more complete understanding of the present disclosure, reference is now made to the following descriptions taken in conjunction with the accompanying drawings.

DETAILED DESCRIPTION

Disclosed is an architecture for magnetic RAM (MRAM) devices and methods of integration with standard semiconductor circuit back-end-of-line (BEOL) fabrication processes. In one embodiment, the MTJ and method of forming disclosed pertain to conventional MRAM. In another embodiment, a spin-torque-transfer (STT) MRAM is disclosed.

Figure 1:
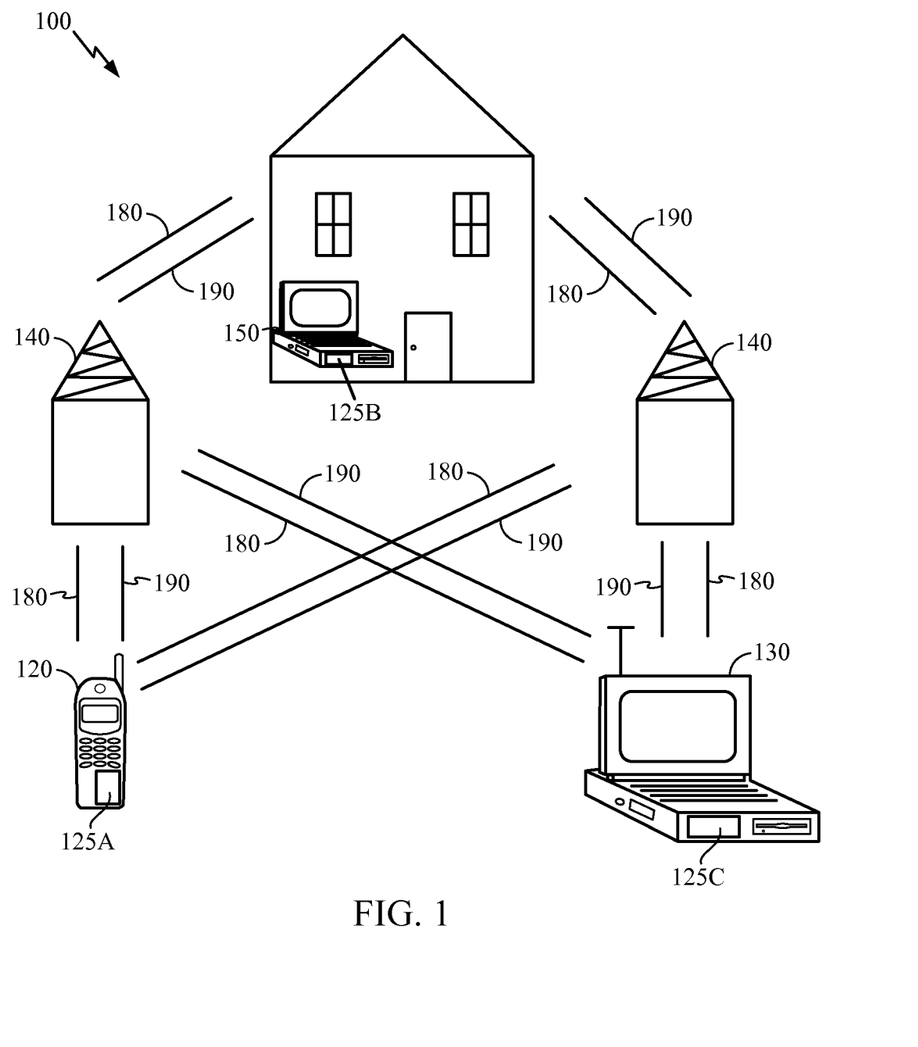
FIG. 1 is a block diagram showing an exemplary wireless communication system in which embodiments of the disclosure may be advantageously employed.

FIG. 1 shows an exemplary wireless communication system 100 in which an embodiment of the disclosure may be advantageously employed. For purposes of illustration, FIG. 1 shows three remote units 120, 130, and 150 and two base stations 140. It will be recognized that conventional wireless communication systems may have many more remote units and base stations. Remote units 120, 130, and 150 include MRAM and/or STT MRAM memory devices 125A, 125B and 125C, which are embodiments of the disclosure as discussed further below. FIG. 1 shows forward link signals 180 from the base stations 140 and the remote units 120, 130, and 150 and reverse link signals 190 from the remote units 120, 130, and 150 to base stations 140.

In FIG. 1, the remote unit 120 is shown as a mobile telephone, the remote unit 130 is shown as a portable computer, and the remote unit 150 is shown as a fixed location remote unit in a wireless local loop system. For example, the remote units may be mobile phones, hand-held personal communication systems (PCS) units, portable data units such as personal data assistants, navigation devices (such as GPS enabled devices), set top boxes, music players, video players, entertainment units, fixed location data units such as meter reading equipment, or any other device that stores or retrieves data or computer instructions, or any combination thereof. Although FIG. 1 illustrates remote units according to the teachings of the disclosure, the disclosure is not limited to these exemplary illustrated units. The disclosed device may be suitably employed in any device which includes MRAM devices.

Figure 2:
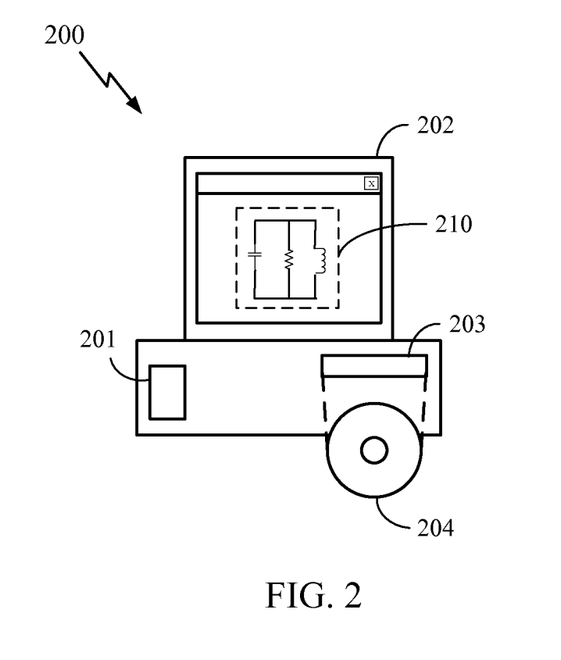
FIG. 2 is a block diagram illustrating a design workstation used for circuit, layout, logic design and integration of MRAM in a semiconductor back-end-of-line (BEOL) process flow, in accordance with an embodiment of the disclosure.

FIG. 2 is a block diagram illustrating a design workstation used for circuit, layout, and logic design of the disclosed semiconductor integrated circuit. A design workstation 200 includes a hard disk 201 containing operating system software, support files, and design software such as CADENCE or ORCAD. The design workstation 200 also includes a display 202 to facilitate design of a circuit design 210. The circuit design 210 may be the memory circuit as disclosed above. A storage medium 204 is provided for tangibly storing the circuit design 210. The circuit design 210 may be stored on the storage medium 204 in a file format such as GDSII or GERBER. The storage medium 204 may be a CD-ROM, DVD, hard disk, flash memory, or other appropriate device. Furthermore, the design workstation 200 includes a drive apparatus 203 for accepting input from or writing output to the storage medium 204.

Data recorded on the storage medium 204 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 204 facilitates the design of the circuit design 210 by decreasing the number of processes for designing semiconductor ICs.

Figure 3:
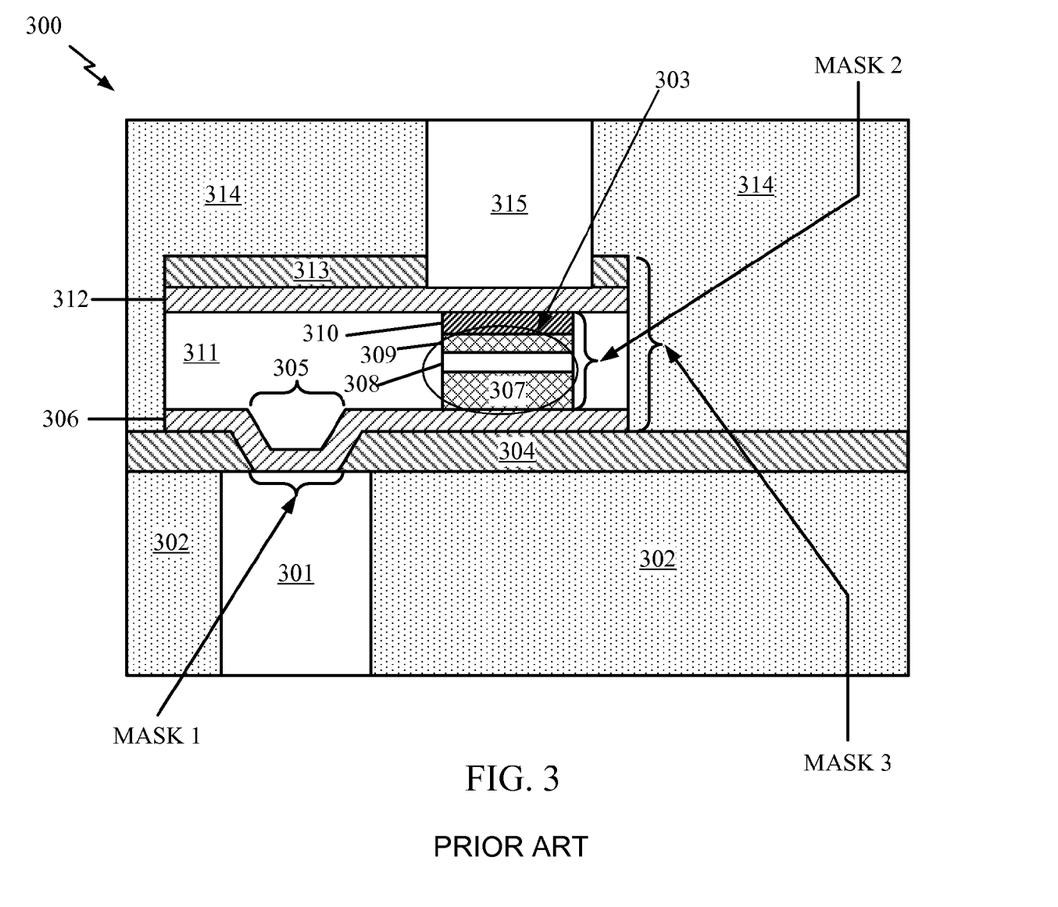
FIG. 3 is a block diagram showing a prior art implementation of an MTJ structure.

To illustrate fabrication issues in conventional MTJ structures, FIG. 3 shows an implementation of an MTJ device 300 as may be conventionally fabricated. A metal interconnect 301 is formed in a via in an interlevel dielectric layer, ILD 302 as part of a back end of line (BEOL) process flow. The ILD 302 separates a magnetic tunnel junction, MTJ 303, for example, from a switching device, such as a transistor.

A dielectric barrier layer 304 is disposed on the ILD 302 with a via 305 formed corresponding to the location of the metal interconnect 301. The various layers of dielectric barriers may be formed, for example, of metal oxides, metal carbides, or metal nitrides. For example, the barrier materials may be $SiO_x$, SiC, SiN. The choice may be made based, for example, on the requirement to be susceptible to or resistant to various etchants. The via 305 corresponding to the location of the metal interconnect 301 is formed using a first mask. A metallization to form a first electrode 306 may be disposed in the via 305 to contact the metal interconnect 301.

A stack of layers forming the MTJ 303 are deposited on the first electrode 306. The stack of layers includes a reference layer 307 (which may be a fixed layer and antiferro-magnet layer, not shown individually), a tunnel barrier layer 308, and a free layer 309. A second electrode 310 is provided on the free layer 309. The MTJ 303 and second electrode 310 will be collectively referred to as the MTJ stack. A second ("stack") mask and a series of etches create the MTJ stack as shown in FIG. 3. A dielectric passivation barrier layer 311 encapsulates the MTJ 303 stack, after which a planarization may be applied to level the dielectric passivation barrier layer 311 and expose the second electrode 310.

A third metalization layer to form a third electrode 312 may be disposed over the planarized dielectric passivation barrier layer 311, making electrical contact with the second electrode 310. Metalizations to form the first, second and third electrodes 306, 310 and 312 may be selected from various metals, including refractory metals such as tantalum (Ta). Tantalum is commonly applied to the standard BEOL due to its desirable characteristics as a diffusion barrier.

A dielectric barrier layer 313 is disposed over the third electrode 312. A third mask is then applied to pattern and define the the lateral extent of the dielectric barrier layer 313, the third electrode 312, the dielectric passivation barrier layer 311, and the first electrode 306, as shown in FIG. 3.

Additional processes may include standard back-end-of-line (BEOL) processes. For example, a further dielectric-layer (as a passivation or an ILD layer) 314 may be deposited on the dielectric barrier layer 313 and the dielectric barrier layer 304. A via is formed in the dielectric barrier layer 313 and the dielectric layer 314. The via is filled with a metal to provide a metal interconnect 315 to contact the third electrode 312, as shown in FIG. 3.

Several problems may occur with the prior art structure described above with respect to FIG. 3. The first mask needs to be critically aligned with the metal interconnect 301 to insure the first electrode 306 contacts the metal interconnect 301. The stack mask—to define the MTJ stack—also needs to be critically aligned, to avoid placement of the MTJ stack near the metal interconnect 301 and the corresponding via 305 (formed by the first mask), and to insure proper definition and registration of the layers of the MTJ stack. A succession of critical dimension alignments from one mask to the next may exceed tolerances and have an adverse affect on yield, and thus cost.

Furthermore, the dielectric barrier layer 304 may be comparable to or thicker than the first electrode 306. Thus, step coverage of the first electrode 306 may not be satisfactory due to topographical variation in the vicinity near the via 305. In other words, electrical contact between the first electrode 306 and the metal interconnect 301 may be inadequate. Therefore, fabrication of the MTJ stack close to the edges of the via 305 should be avoided to assure that all layers of the MTJ 303 are uniform in thickness and flat when deposited. Otherwise the quality and reliability of the MTJ 303 may be adversely compromised. It may occur that some layers of the MTJ 303 are on the order of 1 nm, such as the barrier layer 308, which is fragile and quite sensitive to topography. Increasing the lateral separation between the MTJ 303 and the via 305 to isolate the MTJ 303 from the topography of the via 305 and to ensure flatness may, however, undesirably require more substrate space. Equally important, the additional current path distance through the first electrode 306 from the MTJ 303 to the metal interconnect 301 will increase contact resistance, due at least to sheet resistivity of the first electrode 306.

In spin torque transfer (STT) MRAM the magnetization of the free layer 309 is directly modulated in write mode by electrical current flowing through the junction, i.e., between the reference layer 307 and the free layer 309 by tunneling through the barrier layer 308. Depending on how electrons flow, State 0 or State 1 may be written because the electron current is spin polarized, which sets the free layer polarization. As with conventional MRAM, the electrical current of the device junction is determined in read mode by determining the electron tunneling resistance through the barrier layer 308 between two magnetic layers the reference layer 307 and the free layer 309, whose relative polarizations may be parallel or anti-parallel.

Figure 4:
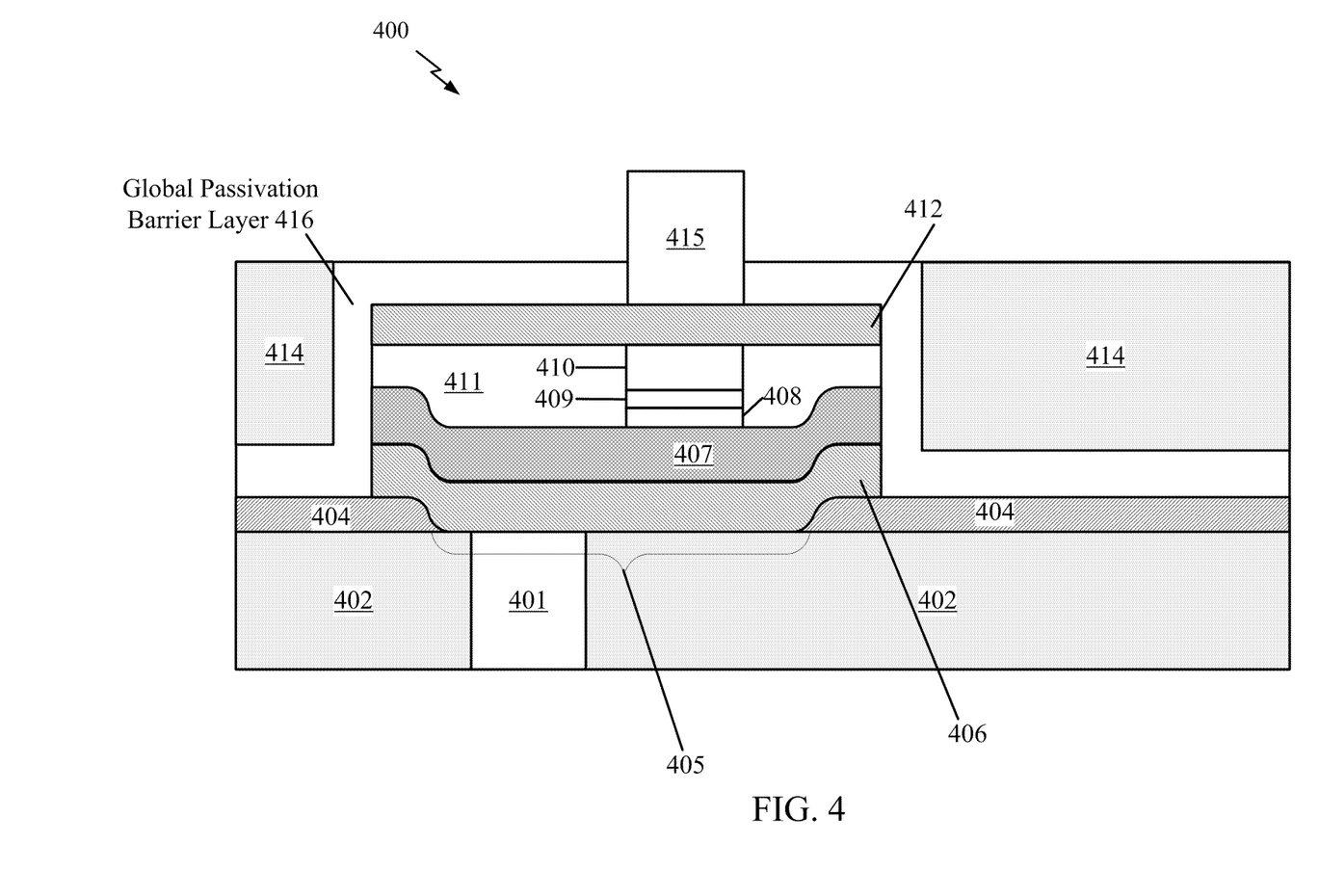
FIG. 4 is a block diagram showing an exemplary MTJ structure, in accordance with an embodiment of the disclosure.

FIG. 4 illustrates an MTJ device 400 according to one embodiment of the disclosure. In this embodiment (as described in more detail below) only one mask defines critical selected nano-scale features of the MTJ structure, but the mask alignment is not a critical dimension. The remaining masks and associated processes benefit from relaxed critical dimension requirements. The process is integration compatible with a semiconductor back-end-of-line (BEOL) process flow. Furthermore, cell scaling to smaller MTJ size may result in faster switching speed, higher drive current densities, lower absolute current and power, improved stability of the MTJ reference stack layers, and reduced stray magnetic field effects. The MTJ device 400 is implemented in STT MRAM although it may alternatively be applicable for conventional MRAM.

In one embodiment of the disclosure, the MTJ fabrication portion of the entire device fabrication process (i.e., including both front-end-of-line (FEOL) and back-end-of-line (BEOL) processes) is structured to allow inclusion of a process flow for formation of at least a nano-scale portion of the MTJ device (including at least a second electrode layer 410, a free layer 409, and a tunnel barrier layer 408, described in detail below). This portion of the additional process flow uses only one mask that is critical as to feature size. The one mask is not sensitive to placement alignment. A second portion of the additional process flow uses two masks that contain larger structural elements of the MTJ device (i.e., the reference layer 407 (which may be a fixed antiferromagnet layer and a synthetic antiferromagnet (SAF) layer, not shown individually), a first electrode 406, and a third electrode 412, also described in detail below), where the mask alignment is relatively non-critical. Thus, a method of integrating an MRAM MTJ into the BEOL process flow for fabrication of integrated circuitry is provided where one device size critical dimension mask and two additional masks where placement alignment is relatively non-critical are employed.

A first mask opens a first contact via (also referred to as a seed opening) 405 in a dielectric barrier layer 404 to expose a metal interconnect 401 in a sub-layer, where the contact via opening may be substantially larger than the metal interconnect 401. The mask allows for the large contact via opening to provide a large planar area to easily position the smaller MTJ structure in subsequent fabrication processes, thereby relaxing critical alignment registration, and improving the uniformity and stability of the to be deposited reference magnetization layer 407. A first electrode 406, larger than the contact via 405, is formed with another mask (also referred to as the "third" mask), thus insuring overlap and contact with the metal interconnect 401 and to circuitry previously formed, i.e., beneath the MTJ device 400, and overlapping the surrounding rim of the contact via 405 (formed by the dielectric barrier layer 404) without requiring critical mask alignment.

The reference layer 407 may be patterned using the same mask as used to form the first electrode 406. The reference layer 407 and first electrode 406 are larger than the nano-scale portion of the MTJ. The larger reference layer 407 and contact via area ensure greater stability of the fixed magnetic reference field over the lifetime of the device, and places the fringing fields at the edges of the reference layer 407 farther from the free layer 409 of the nano-scale portion of the MTJ to reduce the stray field effect.

Two advantages accrue: alignment of the first electrode 406 to connect to the metal interconnect 401 is thus a non-critical alignment, and placement of the nano-scale MTJ portion on the reference layer 407 is non-critical, provided the nano-scale MTJ portion is placed away from any topographical feature, such as the edge associated with the overlap of the reference layer/first electrode 407/406 near the rim of the barrier layer contact via 405. When the metal interconnect formation process require planarization, the nano-scale MTJ portion may be positioned to avoid this area as well.

The nano-scale portion of the MTJ includes a tunnel barrier layer 408 and a free layer 409, referred to as a "stack." The stack may further include a second electrode 410 in contact with the free layer 409, opposite the tunnel barrier layer 408. The stack is patterned and etched using a second mask. In another embodiment, the tunnel barrier layer 408 is formed using the third mask, thereby making the tunnel barrier layer 408 substantially the same in surface area and shape as the reference layer 407 and the first electrode 406.

A third electrode 412 may be patterned with the same third mask used for patterning the reference layer 407 and the first electrode 406, which is again a non-critical alignment.

The contact via 405 is formed in the dielectric barrier 404, and is defined by a first mask pattern. The contact via 405 is larger than the via 305 formed in the conventional structure shown in FIG. 3. The first electrode 406 is formed over a first interlayer dielectric (ILD) 402, the dielectric barrier 404, and the metal interconnect 401, overlapping the edge of the large contact via 405. That is, the first electrode 406 overlaps the rim of the dielectric barrier 404 that forms the boundary of the contact via 405. Positioning the contact via 405 over the metal interconnect 401 is not sensitive to location with respect to the metal interconnect 401, in contrast to the example of the via 305 and metal interconnect 301 shown in FIG. 3. Therefore, placement accuracy of the first mask to form the contact via 405 is not a critical dimension, improving the reliability and yield of this process.

The various layers of dielectric barriers included in the structure, such as the dielectric barrier 404, may be formed, for example, of metal oxides, metal carbides, or metal nitrides. For example, the barrier materials may be $SiO_x$, SiC, SiN. The choice may be made based on the desirability of being susceptible to or resisting various etchants.

The reference layer 407 is deposited over the metallization from which the first electrode 406 is formed before any patterning occurs. Additionally, the tunnel barrier layer 408, free layer 409, and (optionally) a metal layer for the second electrode 410 may be formed over the reference layer 407, successively. The layers 408, 409, 410 may be patterned in a single process with a second mask, and the layers successively etched appropriately to form the MTJ "stack." Whereas the dimensions of the stack may be nano-scale, and have a critical dimension, placement of the mask is not a critical dimension. Provided the area of the contact via 405 has been chosen to be appropriately large, the stack can be formed within and away from the stepped edges of the first electrode 406 and the reference layer 407 at the rim of via contact via 405. The stack may also be positioned over the location of the metal interconnect 401 if dishing in the metal interconnect 401 is not significant.

As an example of dimensions appropriate for an exemplary STT MRAM MTJ, for 65 nm and 45 nm technology nodes, the metal interconnect 401 may be on the order of 70 nm. The first electrode 406 and reference layer 407 may have dimensions where the planar portion defined by the via contact via 405 are at least 70 nm. The cell size of the MRAM may be affected by the size of the first electrode 406 or the third electrode 412. Therefore, the contact via 405 may be larger than the via 305. The critical dimension registration is further relaxed, as long as conductive contact exists between the first electrode 406 and the metal interconnect 401.

The MTJ device 400 includes a second (local) dielectric passivation barrier layer 411 to isolate the stack, and a third electrode layer 412. The third mask, which is non-critical in alignment and is larger than the contact via 405, patterns the MTJ structure from the third electrode layer 412 down to the first electrode 406. The MTJ device 400 also includes a global dielectric passivation barrier layer 416 to encapsulate the layers previously formed and etched. The global dielectric passivation barrier layer 416 inhibits contaminant penetration into (or from) the critical layers of the junction, including the electrodes 406, 410, 412, the fixed reference layer 407, the free layer 409, and the tunnel barrier layer 408.

The MTJ device 400 is completed with subsequent processes that may substantially be a BEOL process flow, e.g., to planarize the structure and provide electrical connectivity to other circuitry, with, for example a metal interconnect 415. It may be appreciated that metal interconnects 401 and 415 may be applied as source and bit lines.

Figure 5:
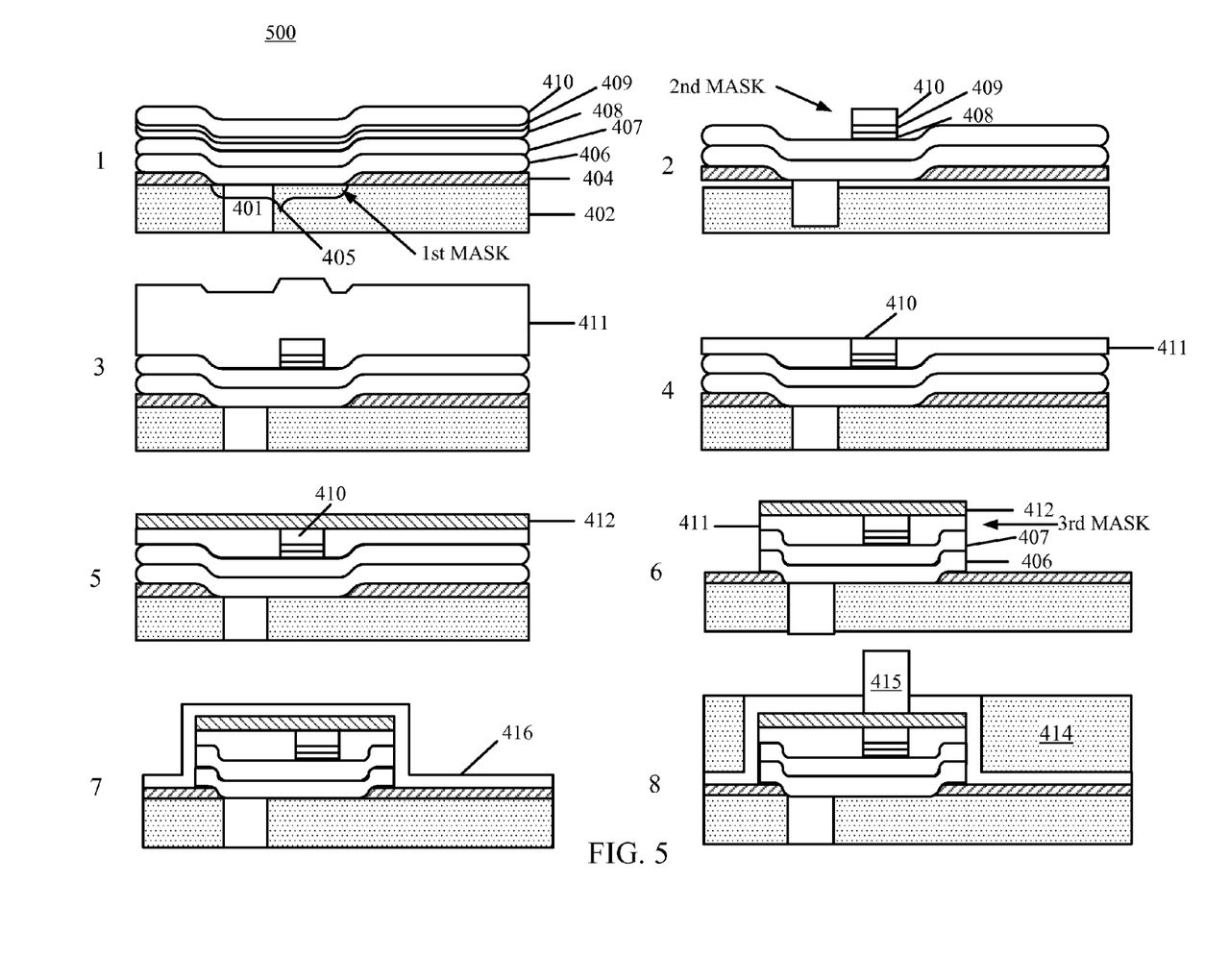
FIG. 5 is a schematic illustration of an exemplary process of forming the embodiment of the MTJ structure shown in FIG. 4.

FIG. 5 illustrates an exemplary process 500 for forming of the MRAM MTJ device 400 according to one embodiment. Process 1 is the point at which the method of forming the MRAM MTJ device 400 is inserted into the standard BEOL process flow, and process 8 is the point at which the conventional BEOL process flow continues.

Process 1: A substrate comprising the ILD 402 with a through hole via containing the metal interconnect 401, is over coated with the first dielectric passivation barrier layer 404. A first mask pattern opens the contact via 405 of a selected size, at least overlapping and larger than the metal interconnect 401. Then the substrate is over-coated with a succession of layers: an electrode layer metallization for the first electrode 406, the magnetization reference layer 407, the tunnel barrier layer 408, the free layer 409, and a second metallization layer for the second electrode 410.

Process 2: A second mask pattern ("stack" mask), defines the critical (or nano scale) portion of the MTJ device. In one embodiment, the size of the critical portion is smaller than the contact via 405. In this embodiment, the second electrode 410, the free layer 409 and the tunnel barrier layer 408 are patterned based upon the second mask. As only a few layers are etched and a relatively thinner portion of the MTJ is processed, this etching process is easier to control, e.g., with respect to undercutting, over-etching, etc., and the process is inherently self-aligned. In this embodiment, the tunnel barrier layer 408 is patterned with the second mask pattern. In another embodiment (not shown), the tunnel barrier layer 408 is patterned with a third mask pattern, as described in Process 6. The second mask may be configured to pattern the critical portion in the shape of an ellipse to enhance the polarization alignment/anti-alignment between the free layer 409 and the magnetization reference layer 407 in the two polarization states. In one embodiment, a portion of the reference layer 407 is etched during the second mask process. For example all or a portion of the SAF layer may be etched. If all of the synthetic antiferromagnet (SAF) layer is etched, a small portion of the fixed antiferromagnet layer may also be etched.

Process 3: After the critical portion of MTJ device 400 is defined, the second dielectric passivation barrier layer 411 is deposited to insulate and encapsulate the critical portion. The second dielectric passivation barrier layer 411 may commonly be silicon nitride, silicon oxide or another dielectric material. It can be the same material as the dielectric passivation barrier layer 404, or another insulating material, depending on characteristics of other fabrication processes.

Process 4: The deposited second dielectric passivation barrier 411 surface is planarized to expose the second electrode 410.

Process 5: Because the dimensions of the second electrode 410 may be small, i.e., nano-scale, an additional metallization is deposited on the surface of the substrate to be later patterned to form the third electrode 412. The third electrode 412 contacts the second electrode 410.

Process 6: A third mask process patterns a cell of the MTJ device 400, from the third electrode 412 down to the first electrode 406, and including the second dielectric passivation barrier 411. A series of material selective etches may be applied to provide the net cell shape (as determined by the third mask) from the third electrode 412 vertically down to, but not including, the dielectric barrier layer 404. Although FIG. 4 shows the same mask process for patterning the third electrode 412, a different mask may be optionally used to form a third electrode with a different shape and size, if desired.

Process 7: A global dielectric passivation barrier layer 416 is then deposited over the entire exposed surface, to further "cap" the structure formed in Process 6. The global dielectric passivation barrier layer 416 can be the same material as the dielectric barrier layer 404, or it can be different. Exemplary materials include silicon carbide, silicon nitride, silicon oxide, and a combination thereof.

Process 8: A second interlayer dielectric (ILD) 414 is deposited over the global dielectric passivation barrier layer 416 and planarized, if deposited with an over-burden, to expose a portion of the passivation barrier layer 416 directly over the nano scale MTJ structure. The planarized ILD 414 may serve as a substrate upon which to build additional levels of device functionality within the BEOL process flow. The same mask (i.e., the second mask) used to pattern the MTJ stack, or another mask, may optionally be used to pattern a contact via in the dielectric passivation barrier layer 416 formed in Process 7. Alternatively, another BEOL specified mask may be used. The contact via permits formation of the metal interconnect 415. The mask registration is not critical, and need not be placed directly over the MTJ stack. However, contact resistance may be reduced by such direct placement.

It may be appreciated that the structure and method disclosed are "manufacture friendly," in that only one of the three masks is used to define critical dimension elements. Moreover, alignment registration of the three masks is not a critical dimension requirement. In addition, it becomes easier to control the polarization of the free layer during memory operation because of a much larger reference layer, which provides a more uniform fixed magnetization field.

A further advantage is improved scalability: fabrication of smaller MTJ structures for the critical free layer portion permits higher drive current density (with lower absolute current) resulting in faster switching, while stability is improved by the larger reference layer.

A still further advantage is the improved yield, because the method is less susceptible to process induced defects and damage that may otherwise occur where critical dimension registration among a greater number of masks is required.

Although the present disclosure and its advantages have been described in detail, it should be understood that various changes, substitutions and alterations can be made herein without departing from the spirit and scope of the disclosure as defined by the appended claims. For example, although a read operation has been used in the discussion, it is envisioned that the disclosure equally applies to write operations. Moreover, the scope of the present application is not intended to be limited to the particular embodiments of the process, machine, manufacture, composition of matter, means, and methods described in the specification. As one of ordinary skill in the art will readily appreciate from the embodiments of the present disclosure, processes, machines, manufacture, compositions of matter, means, and methods, presently existing or later to be developed that perform substantially the same function or achieve substantially the same result as the corresponding embodiments described herein may be utilized according to the present disclosure. Accordingly, the appended claims are intended to include within their scope such processes, machines, manufacture, compositions of matter, means, and methods.

What is claimed is:

1. A magnetic tunnel junction (MTJ) device for a magnetic random access memory (MRAM) device, comprising:
    a substrate having a first metal interconnect;
    a first dielectric passivation barrier layer formed on the substrate, the first dielectric passivation barrier layer having a first contact via opening formed with a first mask pattern to expose the first metal interconnect;
    a first electrode layer formed on the first dielectric passivation barrier layer and extending through the first contact via opening, the first electrode layer in communication with the first metal interconnect;
    a fixed magnetization layer formed on the first electrode layer;
    a tunnel barrier layer formed on the fixed magnetization layer;
    a free magnetization layer formed on the tunnel barrier layer;
    a second electrode layer formed on the free magnetization layer, at least the second electrode layer and the free magnetization layer having a shape based upon a second mask pattern and being located over the first contact via opening; and
    a second dielectric passivation barrier layer formed on the fixed magnetization layer and around the tunnel barrier layer, the free magnetization layer and the second electrode layer, the second dielectric passivation barrier layer only partially covering the second electrode layer, the second dielectric passivation barrier layer and at least a first portion of the fixed magnetization layer having a shape based upon a third mask pattern.

2. The magnetic tunnel junction device of claim 1, in which a tunnel barrier layer shape is based upon the second mask pattern.

3. The magnetic tunnel junction device of claim 1, in which the first contact via opening is at least as wide as the first metal interconnect.

4. The magnetic tunnel junction device of claim 1, in which at least a second portion of the fixed magnetization layer has a shape defined by the second mask pattern.

5. The magnetic tunnel junction device of claim 1, further comprising a third electrode layer formed on the second dielectric passivation barrier layer in communication with the second electrode layer, the third electrode layer having a shape defined by the third mask pattern.

6. The magnetic tunnel junction device of claim 5, further comprising a global dielectric passivation barrier layer disposed over the third electrode layer.

7. The magnetic tunnel junction device of claim 6, further comprising:
a second interlayer dielectric deposited on the global dielectric passivation barrier layer; and
a via opening in the global dielectric passivation barrier layer to expose a portion of the third electrode layer.

8. The magnetic tunnel junction device of claim 1, in which the second mask pattern has an ellipsoid shape.

9. The magnetic tunnel junction device of claim 1, in which the MRAM device is a spin-torque-transfer (STT) MRAM device.

10. The magnetic tunnel junction device of claim 1, integrated into a semiconductor die.

11. The magnetic tunnel junction device of claim 1, integrated into a device selected from a group consisting of a set top box, music player, video player, entertainment unit, navigation device, communications device, personal digital assistant (PDA), fixed location data unit, and a computer.

* * * * *